(12) United States Patent
Hu et al.

(10) Patent No.: US 11,342,397 B2
(45) Date of Patent: May 24, 2022

(54) ARRAY SUBSTRATE AND MANUFACTURING METHOD THEREOF

(71) Applicant: Wuhan China Star Optoelectronics Semiconductor Display Technology Co., LTD., Hubei (CN)

(72) Inventors: Quan Hu, Wuhan (CN); Songshan Li, Wuhan (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 269 days.

(21) Appl. No.: 16/623,124

(22) PCT Filed: Nov. 12, 2019

(86) PCT No.: PCT/CN2019/117364
§ 371 (c)(1),
(2) Date: Dec. 16, 2019

(87) PCT Pub. No.: WO2021/027140
PCT Pub. Date: Feb. 18, 2021

(65) Prior Publication Data
US 2021/0408188 A1    Dec. 30, 2021

(30) Foreign Application Priority Data

Aug. 9, 2019 (CN) .......................... 201910732444.7

(51) Int. Cl.
*H01L 27/32* (2006.01)
*H01L 51/00* (2006.01)
*H01L 51/56* (2006.01)

(52) U.S. Cl.
CPC ...... *H01L 27/3258* (2013.01); *H01L 27/3246* (2013.01); *H01L 27/3272* (2013.01);
(Continued)

(58) Field of Classification Search
None
See application file for complete search history.

(56) References Cited

U.S. PATENT DOCUMENTS 5,621,555 A * 4/1997 Park .................... G02F 1/13624
349/54
2007/0176177 A1 8/2007 Jung et al.
(Continued)

FOREIGN PATENT DOCUMENTS

CN    107706194 A    2/2018
CN    108231791 A    6/2018
(Continued)

*Primary Examiner* — J. E. Schoenholtz
(74) *Attorney, Agent, or Firm* — Benesch, Friedlander, Coplan & Aronoff LLP

(57) ABSTRACT

An array substrate and a manufacturing method thereof are provided. The array substrate includes a flexible substrate, a plurality of thin film transistors, a plurality of replacement units, an organic filling layer, a source and drain layer, a planarization layer, an anode layer, and a pixel definition layer. The organic filling layer is made of a flexible material which has good bendability. Thus, a risk of breakage or crack during a bending process is reduced, thereby realizing a dynamic folding of the array substrate.

10 Claims, 4 Drawing Sheets

(52) U.S. Cl.
CPC .......... *H01L 51/0097* (2013.01); *H01L 51/56* (2013.01); *H01L 2227/323* (2013.01); *H01L 2251/5338* (2013.01)

(56) References Cited

U.S. PATENT DOCUMENTS

| | | | | |
|---|---|---|---|---|
| 2017/0317150 | A1* | 11/2017 | Chung | H01L 27/3276 |
| 2018/0166019 | A1* | 6/2018 | Lee | H01L 51/5203 |
| 2018/0342707 | A1 | 11/2018 | Lee et al. | |
| 2019/0295475 | A1* | 9/2019 | Lee | H01L 27/3276 |
| 2020/0185479 | A1 | 6/2020 | Ding | |
| 2020/0350512 | A1* | 11/2020 | Guo | G06F 3/0412 |

FOREIGN PATENT DOCUMENTS

| | | |
|---|---|---|
| CN | 108933162 A | 12/2018 |
| CN | 109638174 A | 4/2019 |

* cited by examiner

ARRAY SUBSTRATE AND MANUFACTURING METHOD THEREOF

FIELD OF DISCLOSURE

The present disclosure relates to the field of display technologies, and in particular, to an array substrate and a manufacturing method thereof.

BACKGROUND

Active matrix organic light-emitting diode (AMOLED) display panels have gradually become a new generation display technology due to their characteristics of high contrast, wide color gamut, low power consumption, and foldability. In comparison with conventional liquid crystal displays (LCDs), organic light-emitting diode (OLED) display panels are easy to be flexible, and are a key technology for wearable and foldable products. However, currently, the OLED display panel in the display industry can only achieve static folding (SF), which is because the current panel manufacturing technology employs more inorganic layers with poor bending resistance. In order to achieve dynamic folding (DF), a stress in the inorganic layer is difficult to release, and the inorganic layer is easily broken or cracked during a bending process. The crack easily extends along the inorganic layer, causing damage to a structure of the entire panel, eventually resulting in inferior display quality.

Therefore, it is necessary to provide a new type of an array substrate and a manufacturing method thereof to overcome the technical problems in the prior art.

SUMMARY OF DISCLOSURE

An object of the present disclosure is to provide an array substrate, which capable of maximally replacing an inorganic layer of the conventional array substrate with a bendable flexible material while maintaining a function of thin film transistors, thereby solving the problem that the inorganic layer is broken or cracked during a bending process.

In order to achieve the above object, an embodiment of the present disclosure provides an array substrate. The array substrate includes a flexible substrate, a plurality of thin film transistors, a plurality of replacement units, an organic filling layer, a source and drain layer, a planarization layer, an anode layer, and a pixel definition layer. The plurality of thin film transistors and the plurality of replacement units are disposed on the flexible substrate. The replacement units and the thin film transistors are spaced apart from each other. Specifically, the organic filling layer is disposed on the flexible substrate. The organic filling layer fills gaps between the thin film transistors and the replacement units and covers the thin film transistors and the replacement units. The source and drain layer is disposed on the organic filling layer. The planarization layer is disposed on the source and drain layer. The anode layer is disposed on the planarization layer. The pixel definition layer is disposed on the anode layer.

Furthermore, material of the organic filling layer includes polyimide or acrylic.

Furthermore, each of the thin film transistors includes a thermal insulation layer, a buffer layer, an active layer, a first insulating layer, and a first metal layer. Specifically, the thermal insulation layer is disposed on the flexible substrate. The buffer layer is disposed on the thermal insulation layer. The active layer is disposed on the buffer layer. The first insulating layer is disposed on the active layer. The first metal layer is disposed on the first insulating layer. The source and drain layer is electrically connected to the active layer.

Furthermore, the first insulating layer has the same shape and size as the first metal layer.

Furthermore, the array substrate further includes a second insulating layer disposed on the first metal layer and a second metal layer disposed on the second insulating layer.

Furthermore, the organic filling layer is disposed between the first metal layer and the second insulating layer.

Furthermore, each of the replacement units includes a thermal insulation layer, a buffer layer, a first insulating layer, and a first metal layer. Specifically, the thermal insulation layer is disposed on the flexible substrate. The buffer layer is disposed on the thermal insulation layer. The first insulating layer is disposed on the buffer layer. The first metal layer is disposed on the first insulating layer. The source and drain layer is electrically connected to the first metal layer.

Furthermore, the organic filling layer includes a first organic layer and a second organic layer disposed on the first organic layer. The first organic layer completely covers the replacement units and the thin film transistors, or the first organic layer completely covers the replacement units.

Furthermore, a laminated thickness of the thermal insulation layer, the buffer layer, the active layer, the first insulating layer, and the first metal layer is less than or equal to a thickness of the first organic layer.

Another embodiment of the present disclosure provides an manufacturing method of an array substrate, including the following steps.

providing a flexible substrate;

forming a thermal insulation layer on the flexible substrate;

forming a buffer layer on the thermal insulation layer;

forming an active layer on the buffer layer, patterning the active layer, and doping the active layer;

forming a first insulating layer on the active layer;

forming a first metal layer on the first insulating layer, and patterning the first metal layer;

forming a plurality of thin film transistors and a plurality of replacement units by sequentially etching the first insulating layer, the buffer layer, and the thermal insulation layer, where the replacement units and the thin film transistors are spaced apart from each other;

forming a first organic layer by depositing an organic material on the flexible substrate, where the first organic layer fills gaps between the thin film transistors and the replacement units and covers the thin film transistors and the replacement units;

forming a source and drain layer over the first organic layer, and patterning the source and drain layer, where a portion of the source and drain layer is electrically connected to the first metal layer;

forming a planarization layer on the source and drain layer;

forming an anode layer on the planarization layer; and forming a pixel definition layer on the anode layer.

Furthermore, between a step of forming the first organic layer and a step of forming the source and drain layer, the method further including:

forming a second insulating layer over the first metal layer, and patterning the second insulating layer; and forming a second metal layer on the second insulating layer, and patterning the second metal layer.

Furthermore, between a step of forming the second metal layer and the step of forming the source and drain layer, the method further includes:

forming a second organic layer by depositing an organic material on the first organic layer, where the second organic layer covers the second metal layer and the second insulating layer.

Advantages of the present disclosure are as follow. The present disclosure provides an array substrate and a manufacturing method. The array substrate is capable of maximally replacing an inorganic layer of the conventional array substrate with a bendable flexible material while maintaining a function of thin film transistors. Therefore, the technical problems that a stress in the inorganic layer is difficult to release is fundamentally solved, and a risk of the inorganic layer being broken or cracked during a bending process is reduced, thereby realizing a dynamic folding of the array substrate.

Figure 1:
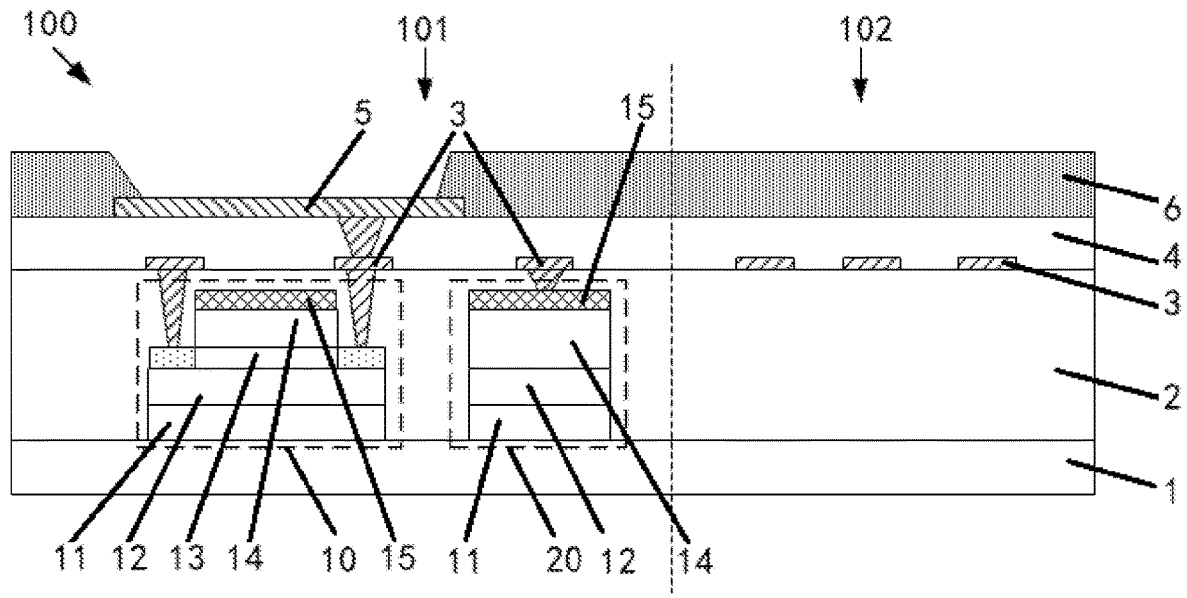
FIG. 1 is a schematic diagram of an array substrate of a first embodiment of the present disclosure.

Reference numerals of components in the drawings are as follows.

1 flexible substrate, 2 organic filling layer, 3 source and drain layer, 4 planarization layer, 5 anode layer, 6 pixel definition layer, 10 thin film transistor, 11 thermal insulation layer, 12 buffer layer, 13 active layer, 14 first insulating layer, 15 first metal layer, 16 second insulating layer, 17 second metal layer, 20 replacement unit, 21 first organic layer, 22 second organic layer, 100 array substrate, 101 display area, 102 bending area

DETAILED DESCRIPTION

The following description of the embodiments with reference to the accompanying drawings is used to illustrate particular embodiments of the present disclosure. The directional terms referred in the present disclosure, such as "upper", "lower", "front", "rare", "left", "right", "inner", "outer", "side surface", "transverse direction" etc. are only directions with regard to the accompanying drawings. Therefore, the directional terms used for describing and illustrating the present disclosure are not intended to limit the present disclosure. In the drawings, units with similar structures are indicated by the same reference number.

First Embodiment

Please refer to FIG. 1, which is a schematic diagram of an array substrate 100 of a first embodiment of the present disclosure. The array substrate 100 includes a flexible substrate 1, a plurality of thin film transistors (TFTs) 10, a plurality of replacement units 20, an organic filling layer 2, a source and drain layer 3, a planarization layer 4, an anode layer 5, and a pixel definition layer 6. The plurality of thin film transistors 10 and the plurality of replacement units 20 are disposed on the flexible substrate 1. The replacement units 20 and the thin film transistors 10 are spaced apart from each other. Specifically, the organic filling layer 2 is disposed on the flexible substrate 1. The organic filling layer 2 fills gaps between the thin film transistors 10 and the replacement units 20 and covers the thin film transistors 10 and the replacement units 20. The source and drain layer 3 is disposed on the organic filling layer 2. The planarization layer 4 is disposed on the source and drain layer 3. The anode layer 5 is disposed on the planarization layer 4. The pixel definition layer 6 is disposed on the anode layer 5.

The organic filling layer 2 is made of a flexible material, including polyimide or acrylic, which is an insulating organic photoresist material. The organic filling layer 2 has good bendability. The embodiment of the present disclosure replaces an inorganic layer of the conventional array substrate with the organic filling layer 2. Therefore, the problem that a stress in the inorganic layer is difficult to release is fundamentally solved, and a dynamic folding of the array substrate 100 is realized.

In the embodiment, as shown in FIG. 1, each the thin film transistor 10 includes a thermal insulation layer11, a buffer layer12, an active layer13, a first insulating layer14 and a first metal layer15 which are disposed layer-by-layer. Specifically, the thermal insulation layer 11 is disposed on the flexible substrate 1. The buffer layer 12 is disposed on the thermal insulation layer 11. The active layer 13 is disposed on the buffer layer 12. The first insulating layer 14 is disposed on the active layer 13. The first metal layer 15 serves as a gate and is disposed on the first insulating layer 14. The source and drain layer 3 is electrically connected to the active layer 13. Material of the first insulating layer 14 includes SiNx. Material of the first metal layer 15 includes molybdenum (Mo). Material of the thermal insulation layer 11 includes SiOx to prevent that high heat of the active layer 13 upon crystallization affects the flexible substrate 1 below.

In each the thin film transistor 10, the first insulating layer 14 has the same shape and size as the first metal layer 15. The thermal insulation layer 11, the buffer layer12, and the active layer13 have the same shape and size. The shape and size of the first insulating layer 14 is smaller than the shape and size of the active layer 13.

In this embodiment, as shown in FIG. 1, each the replacement unit 20 includes a thermal insulation layer 11, a buffer layer 12, a first insulating layer 14, and a first metal layer 15. Specifically, the thermal insulation layer 11 is disposed on the flexible substrate 1. The buffer layer 12 is disposed on the thermal insulation layer 11. The first insulating layer 14 is disposed on the buffer layer 12. The first metal layer 15 is disposed on the first insulating layer 14. The source and drain layer 3 is electrically connected to the first metal layer 15. In each the replacement unit 20, the thermal insulation layer 11, the buffer layer 12, the first insulating layer 14, and the first metal layer 15 have the same shape and size.

It should be noted that, referring to FIG. 1, a display area 101 is defined on a position corresponding to the thin film transistors 10 and the replacement units 20. A bending area 102 is defined on a position where is free from the thin film transistors 10 and the replacement units 20. A corresponding position of the replacement units 20 is also referred to as a replacement area. The first metal layer 15 of the thin film transistor 10 is electrically connected to the first metal layer 15 of the replacement unit 20, and electrically connected to the source and drain layer 3 of the first metal layer 15 of the replacement unit 20, and electrically connected to the source and drain layer 3 on the bending area 102. The source and drain layer 3 on the bending area 102 serves as an external lead and is connected to an external scan signal. The first metal layer 15 of the thin film transistor 10 is connected to an external data signal through the source and drain layer 3 located thereon.

The array substrate 100 is capable of maximally replacing an inorganic layer of the conventional array substrate with a bendable flexible material while maintaining a function of thin film transistors. Therefore, the technical problem that a stress in the inorganic layer is difficult to release is fundamentally solved, thereby realizing a dynamic folding of the array substrate 100.

Second Embodiment

Figure 2:
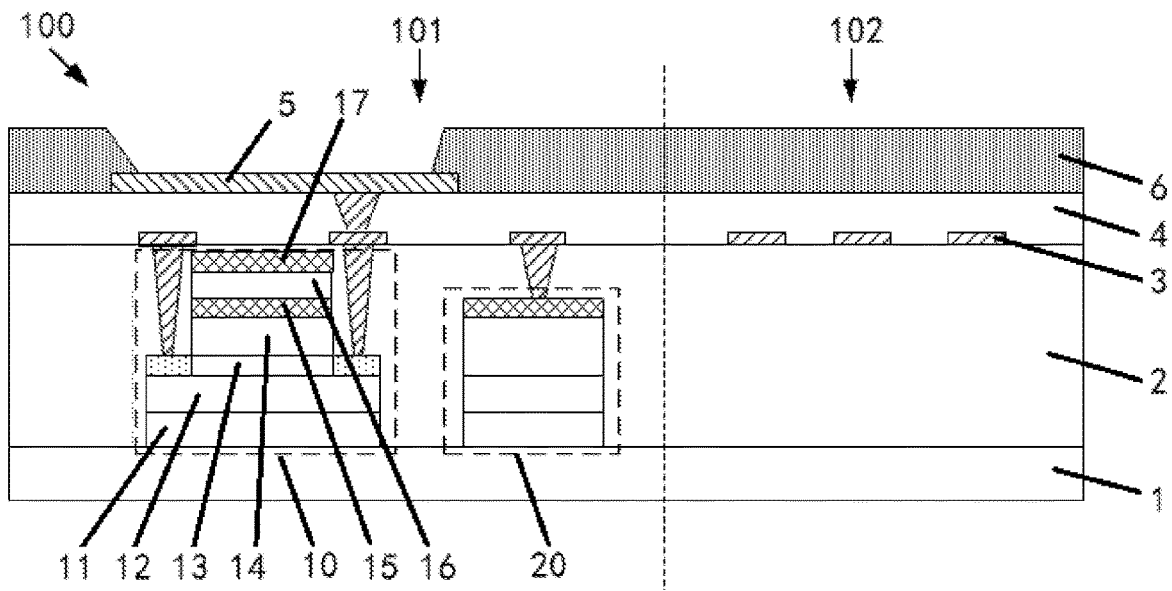
FIG. 2 is a schematic diagram of an array substrate of a second embodiment of the present disclosure.

Referring to FIG. 2, all the technical features in the first embodiment are included in the second embodiment, except that each of the thin film transistors 10 of the array substrate 100 in the second embodiment further includes a second insulating layer 16 and a second metal layer 17. Specifically, the second insulating layer 16 is disposed on the first metal layer 15. The second metal layer 17 is disposed on the second insulating layer 16. Material of the second insulating layer 16 includes SiNx. Material of the second metal layer 17 includes molybdenum (Mo).

The second insulating layer 16 has the same shape and size as the second metal layer 17, and has the same shape and size as the first insulating layer 14 and the first metal layer 15.

The second metal layer 17 serves as a layer of a capacitor plate in a driving circuit, and overlaps with the first metal layer 15 that drives the thin film transistors 10 to form a capacitor. The first metal layer 15 serves as a gate. The array substrate 100 in this embodiment is preferably used in an organic light-emitting diode (OLED) display device. One pixel driving circuit includes a plurality of the thin film transistors (TFTs) 10. The circuit preferably includes 7 TFTs and 1 capacitor (7T1C), and the capacitor plate is formed on only one of the TFTs.

Third Embodiment

Figure 3:
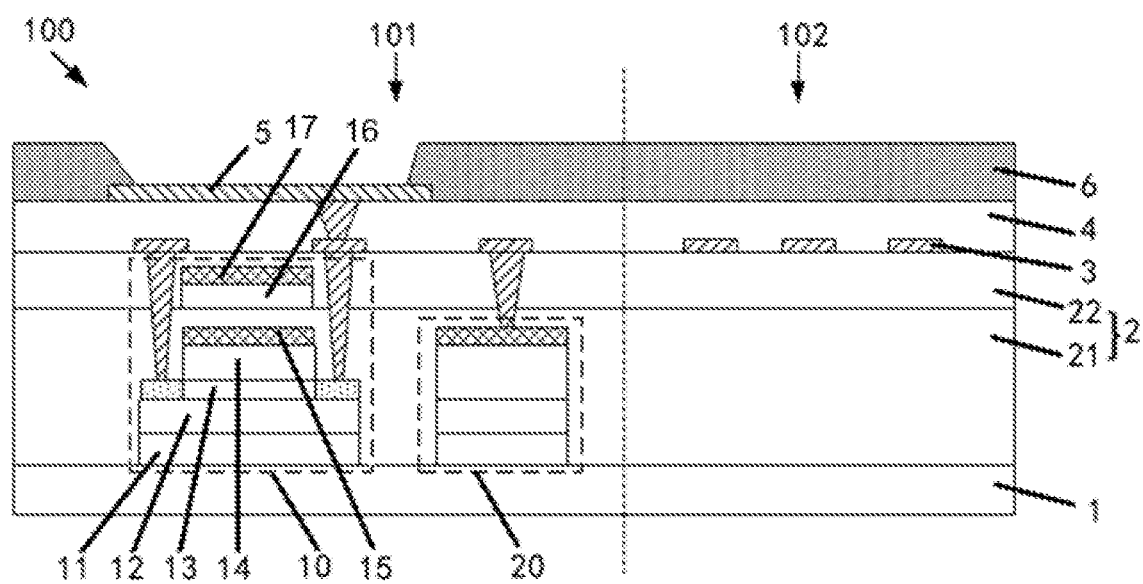
FIG. 3 is a schematic diagram of an array substrate of a third embodiment of the present disclosure.

Referring to FIG. 3, all the technical features in the second embodiment are included in the third embodiment, except that the organic filling layer 2 is composed of one layer in the second embodiment, and the organic filling layer 2 is composed of a plurality of layers in the third embodiment.

Referring to FIG. 3, in the third embodiment, the organic filling layer 2 includes a first organic layer 21 and a second organic layer 22 on the first organic layer 21. The first organic layer 21 completely covers the replacement units 20 and the thin film transistors 10. Alternatively, the first organic layer 21 completely covers the replacement units 20. More specifically, a laminated thickness of the thermal insulation layer 11, the buffer layer 12, the active layer 13, the first insulating layer 14, and the first metal layer 15 is less than or equal to a thickness of the first organic layer 21.

The thickness of the first organic layer 21 ranges from 1.5 um to 2.5 um, and a thickness of the second organic layer 22 ranges from 1 um to 2 um.

Figure 4:
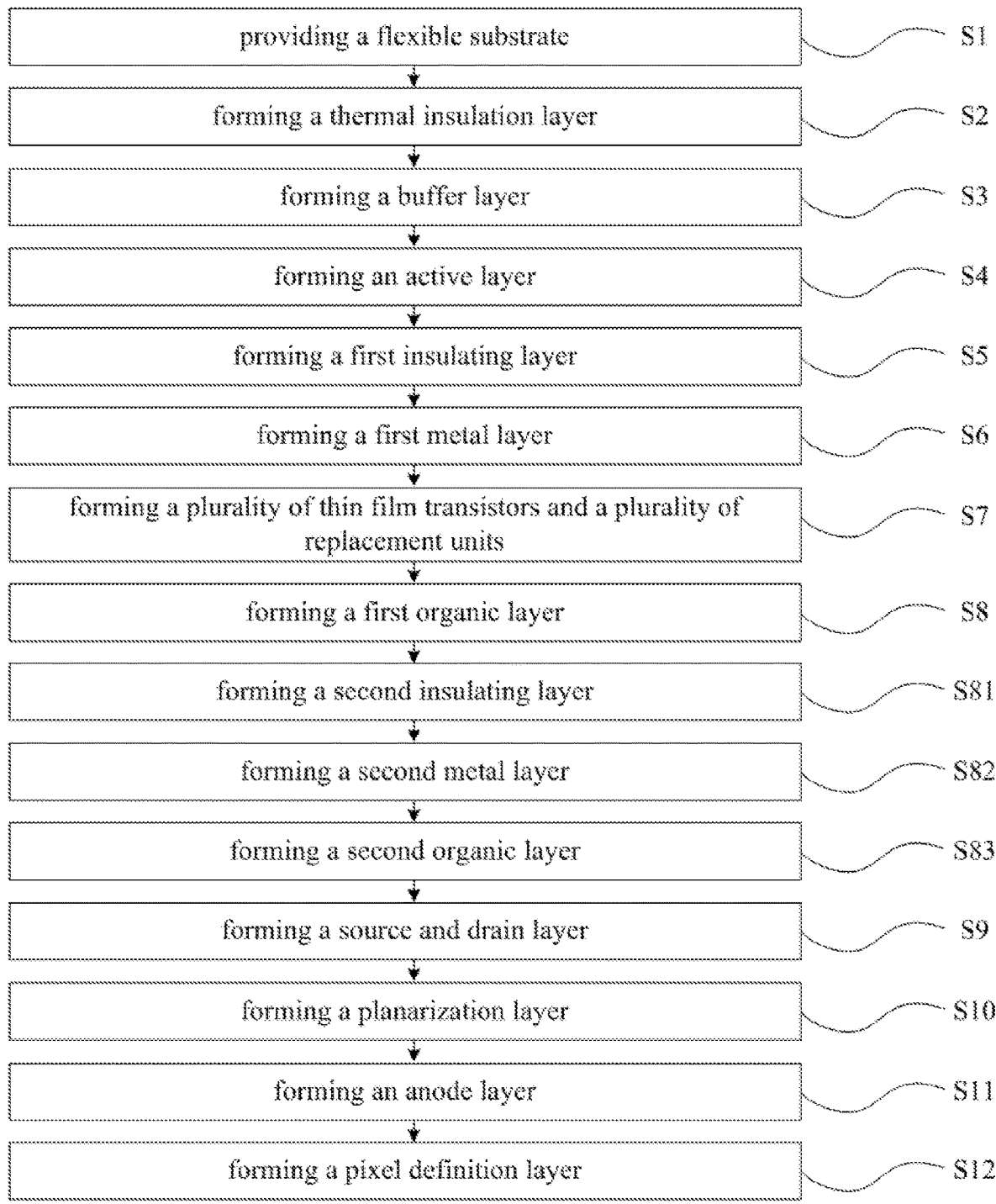
FIG. 4 is a flowchart showing a manufacturing method of an array substrate of an embodiment of the present disclosure.

Please refer to FIG. 4, which is a flowchart showing a manufacturing method of an array substrate 100 of an embodiment of the present disclosure, including steps as follows.

In a step S1, a flexible substrate 1 is provided.

In a step S2, a thermal insulation layer 11 is formed on the flexible substrate 1.

In a step S3, a buffer layer 12 is formed on the thermal insulation layer 11.

In a step S4, an active layer 13 is formed on the buffer layer 12, the active layer 13 is patterned and doped.

In a step S5, a first insulating layer 14 is formed on the active layer 13.

Figure 5:
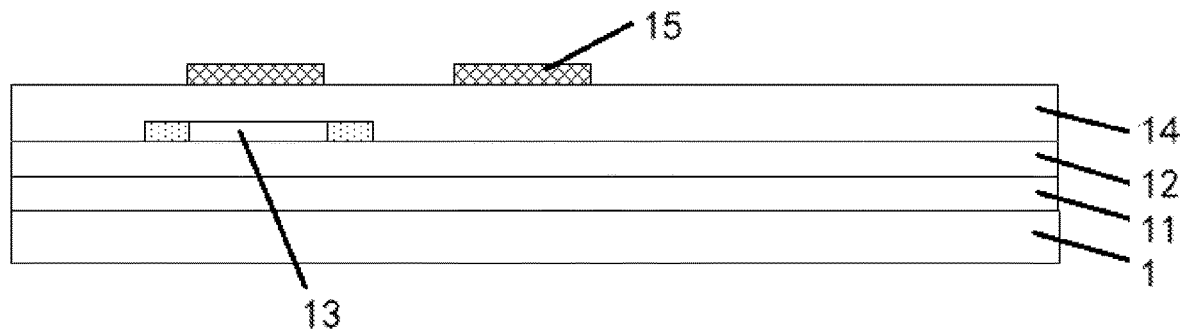
FIG. 5 is a schematic diagram of a semi-finished product of FIG. 4, where a first metal layer is formed.
Figure 6:
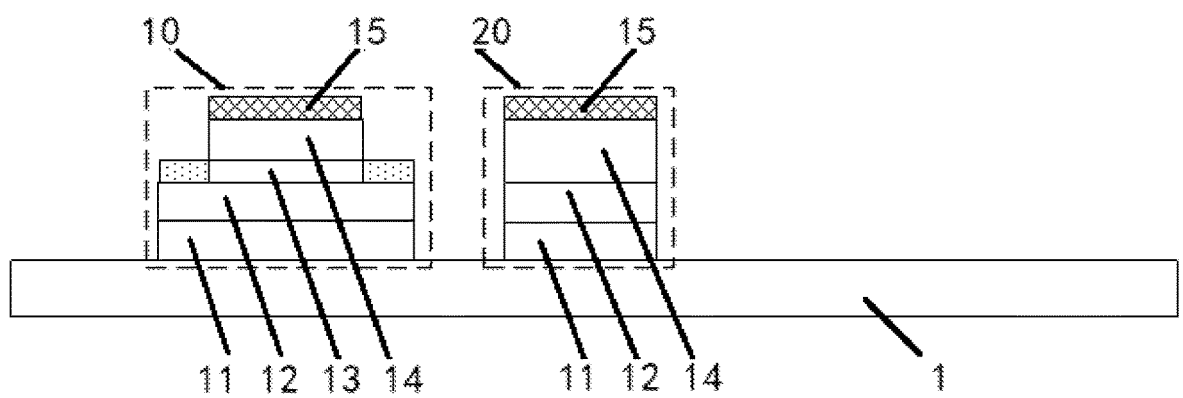
FIG. 6 is a schematic diagram of a semi-finished product of FIG. 4, where thin film transistors and replacement units are formed.

In a step S6, a first metal layer 15 is formed on the first insulating layer 14, and the first metal layer 15 is patterned. The shape of the patterned first metal layer 15 is shown in FIG. 5. Referring to FIG. 6, the patterned first insulating layer 14 and the patterned first metal layer 15 have the same shape and size.

In a step S7, a plurality of thin film transistors 10 and a plurality of replacement units 20 are formed by sequentially etching the first insulating layer 14, the buffer layer 12, and the thermal insulation layer 11. Referring to FIG. 6, the replacement units 20 and the thin film transistors 10 are spaced apart from each other.

In a step S8, a first organic layer 21 is formed by depositing an organic material on the flexible substrate 1. The first organic layer 21 fills gaps between the thin film transistors 10 and the replacement units 20 and covers the thin film transistors 10 and the replacement units 20. That is, a laminated thickness of the thermal insulation layer 11, the buffer layer 12, the active layer 13, the first insulating layer 14, and the first metal layer 15 is less than or equal to a thickness of the first organic layer 21.

In a step S9, a source and drain layer 3 is formed over the first organic layer 21, and the source and drain layer 3 is patterned. A portion of the source and drain layer 3 is electrically connected to the active layer 13, and another portion of the source and drain layer 3 is electrically connected to the first metal layer 15.

In a step S10, a planarization layer 4 is formed on the source and drain layer 3.

In a step S11, an anode layer 5 is formed on the planarization layer 4.

In a step S12, a pixel definition layer 6 is formed on the anode layer 5.

Please refer to FIG. 4, in this embodiment, between the step S8 of forming the first organic layer 21 and the step S9 of forming the source and drain layer 3, the method further includes steps as follows.

In a step S81, a second insulating layer 16 is formed over the first metal layer 15, and the second insulating layer 16 is patterned.

In a step S82, a second metal layer 17 is formed on the second insulating layer 16, and the second metal layer 17 is patterned.

In this embodiment, between the step S82 of forming the second metal layer 17 and the step S9 of forming the source and drain layer 3, the method further includes a step as follows.

In a step S83, a second organic layer 22 is formed by depositing an organic material on the first organic layer 21. The second organic layer 22 covers the second metal layer 17 and the second insulating layer 16. The first organic layer 21 and the second organic layer 22 on the first organic layer 21 together constitute an organic filling layer 2. The organic filling layer 2 fills gaps of the thin film transistors 10 and the replacement units 20 and covers the thin film transistors 10 and the replacement units 20.

In should be noted that in other embodiments, the step S81 of forming the second insulating layer 16 and the step S82 of forming the second metal layer 17 may be performed between the step S6 of forming the first metal layer 15 and the step S7 of forming the thin film transistors 10 and the replacement units 20. At this time, it is only necessary to form the organic filling layer 2 (that is, the first organic layer 21) once, and the step S83 of forming the second organic layer 22 can be omitted.

Therefore, it should also be noted that in some alternative embodiments, the all steps of the method described herein may occur out of the order. For example, two consecutive steps may be performed substantially simultaneously, or the two steps may sometimes be performed in a reverse sequence.

Advantages of the present disclosure are as follow. The present disclosure provides an array substrate and a manufacturing method. The array substrate is capable of maximally replacing an inorganic layer of the conventional array substrate with a bendable flexible material while maintaining a function of thin film transistors. Therefore, the technical problems that a stress in the inorganic layer is difficult to release is fundamentally solved, and a risk of the inorganic layer being broken or cracked during a bending process is reduced, thereby realizing a dynamic folding of the array substrate, and reducing the number of masks.

The above descriptions are merely preferable embodiments of the present disclosure. Any modification or replacement made by those skilled in the art without departing from the spirit and principle of the present disclosure should fall within the protection scope of the present disclosure.

What is claimed is:

1. An array substrate, comprising:
  a flexible substrate;
  a plurality of thin film transistors, wherein each of the thin film transistors comprises:
    a thermal insulation layer disposed on the flexible substrate;
    a buffer layer disposed on the thermal insulation layer;
    an active layer disposed on the buffer layer;
    a first insulating layer disposed on the active layer; and
    a first metal layer disposed on the first insulating layer, wherein the source and drain layer is electrically connected to the active layer;
  a plurality of replacement units disposed on the flexible substrate, wherein the replacement units and the thin film transistors are spaced apart from each other;
  an organic filling layer disposed on the flexible substrate, wherein the organic filling layer fills gaps between the thin film transistors and the replacement units and covers the thin film transistors and the replacement units;
  a source and drain layer disposed on the organic filling layer;
  a planarization layer disposed on the source and drain layer;
  an anode layer disposed on the planarization layer; and
  a pixel definition layer disposed on the anode layer.

2. The array substrate as claimed in claim 1, wherein material of the organic filling layer comprises polyimide or acrylic.

3. The array substrate as claimed in claim 1, wherein the first insulating layer has the same shape and size as the first metal layer.

4. The array substrate as claimed in claim 1, further comprising:
  a second insulating layer disposed on the first metal layer; and
  a second metal layer disposed on the second insulating layer.

5. The array substrate as claimed in claim 4, wherein the organic filling layer is disposed between the first metal layer and the second insulating layer.

6. The array substrate as claimed in claim 1, wherein each of the replacement units comprises:
  a thermal insulation layer disposed on the flexible substrate;
  a buffer layer disposed on the thermal insulation layer;
  a first insulating layer disposed on the buffer layer; and
  a first metal layer disposed on the first insulating layer;
  wherein the source and drain layer is electrically connected to the first metal layer.

7. The array substrate as claimed in claim 1, wherein the organic filling layer comprises a first organic layer and a second organic layer disposed on the first organic layer; and
  the first organic layer completely covers the replacement units and the thin film transistors, or the first organic layer completely covers the replacement units.

8. A manufacturing method of an array substrate, comprising:
  providing a flexible substrate;
  forming a thermal insulation layer on the flexible substrate;
  forming a buffer layer on the thermal insulation layer;
  forming an active layer on the buffer layer, patterning the active layer, and doping the active layer;
  forming a first insulating layer on the active layer;
  forming a first metal layer on the first insulating layer, and patterning the first metal layer;
  forming a plurality of thin film transistors and a plurality of replacement units by sequentially etching the first insulating layer, the buffer layer, and the thermal insulation layer, wherein the replacement units and the thin film transistors are spaced apart from each other;
  forming a first organic layer by depositing an organic material on the flexible substrate, wherein the first organic layer fills gaps between the thin film transistors and the replacement units and covers the thin film transistors and the replacement units;
  forming a source and drain layer over the first organic layer, and patterning the source and drain layer, wherein a portion of the source and drain layer is electrically connected to the first metal layer;
  forming a planarization layer on the source and drain layer;
  forming an anode layer on the planarization layer; and
  forming a pixel definition layer on the anode layer.

9. The manufacturing method of the array substrate as claimed in claim 8, wherein between a step of forming the first organic layer and a step of forming the source and drain layer, the method further comprises:
  forming a second insulating layer over the first metal layer, and patterning the second insulating layer; and
  forming a second metal layer on the second insulating layer, and patterning the second metal layer.

10. The manufacturing method of the array substrate as claimed in claim 9, wherein between a step of forming the second metal layer and the step of forming the source and drain layer, the method further comprises:

forming a second organic layer by depositing an organic material on the first organic layer, wherein the second organic layer covers the second metal layer and the second insulating layer.

\* \* \* \* \*